United States Patent [19]
Malhi

[11] Patent Number: 5,294,559
[45] Date of Patent: Mar. 15, 1994

[54] METHOD OF FORMING A VERTICAL TRANSISTOR

[75] Inventor: Satwinder Malhi, Garland, Tex.

[73] Assignee: Texas Instruments Incorporated, Dallas, Tex.

[21] Appl. No.: 559,756

[22] Filed: Jul. 30, 1990

[51] Int. Cl.$^5$ .......................................... H01L 21/265
[52] U.S. Cl. .......................................... 437/40; 437/62; 437/67; 437/974; 148/DIG. 85; 148/DIG. 135
[58] Field of Search ................. 437/40, 62, 63, 67, 437/68, 974, 72; 148/DIG. 50, DIG. 85, DIG. 88, DIG. 135, DIG. 168, DIG. 86; 357/23.4, 55, 49

[56] References Cited
U.S. PATENT DOCUMENTS
4,837,186  6/1989  Ohata et al. ........................ 437/228

FOREIGN PATENT DOCUMENTS
0064045  4/1983  Japan ........................ 437/67
0174735  8/1986  Japan ........................ 437/62

Primary Examiner—Brian E. Hearn
Assistant Examiner—Tuan Nguyen
Attorney, Agent, or Firm—Stanton C. Braden; Richard L. Donaldson

[57] ABSTRACT

A vertical transistor comprises a semiconductor layer of a first conductivity type having a first doped region (48) formed therein. A second doped region (50) is formed within the first doped region (48). A gate overlies the first doped region such that a low impedance path between the second doped region and the semiconductor layer may be created responsive to a voltage applied to the gate. Isolation regions (38 and 58) are formed through the semiconductor layer to isolate the transistor from other devices.

7 Claims, 2 Drawing Sheets

METHOD OF FORMING A VERTICAL TRANSISTOR

TECHNICAL FIELD OF THE DISCLOSURE

This invention relates in general to integrated circuits, and more particularly to a novel transistor and method of forming the same.

BACKGROUND OF THE DISCLOSURE

In power integrated circuits, there is frequently a need for several power devices to be formed on a single chip. One such application is an H-bridge driver circuit for motor control. In order to reduce the cost and increase the producibility of an integrated circuit having multiple power devices, the size of each power device must be minimized.

The size of a power device is dictated mainly by the need for a given low on-resistance ($R_{on}$) The minimum onresistance per unit area is normally associated with a vertical MOS device, as opposed to a lateral device. In such devices, the gate is formed on a semiconductor surface, the source is formed in a doped region of an opposite conductivity type, and the drain contact is located at the bottom of the chip. Hence, the substrate acts as the drain. When a voltage is applied to the gate, a channel is formed through the doped region, and current may flow from surface source to substrate drain.

Vertical MOS devices provide several advantages over their lateral counterparts. First, the channel width per unit area, and hence, current handling capability is higher. Further, the drain contact is at the bottom in the vertical transistors and the metal scheme required to handle high currents is simplified.

Unfortunately, in a bulk process, if more than one device is integrated on a chip using bottom drains, all drains are inherently connected together. This fairly limits the complexity of a circuit using these devices. In one proposed device, vertical transistors are set in polysilicon. This structure somewhat reduces the coupling between drains, but does not isolate the drains to a desirable degree.

Therefore, a need has arisen to provide a vertical transistor which may be isolated from other devices.

SUMMARY OF THE DISCLOSURE

In accordance with the present invention, a vertical transistor and method for forming the same is provided which substantially eliminates disadvantages associated with prior such transistors.

In the present invention, a vertical transistor comprises a semiconductor layer of a first conductivity type having a first doped region of a second conductivity type formed therein. A second doped region of the first conductivity type is formed in the first doped region. A gate overlies the first doped region such that a voltage applied to the gate creates a channel in the first doped region providing a low impedance path between the second doped region and the semiconductor layer. Isolation regions are formed through the semiconductor layer to isolate the transistor from other devices.

This aspect of the invention provides the technical advantage that several such devices may be fabricated on a single chip without having inherent connections between the drains of the devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE DISCLOSURE

Figure 1:
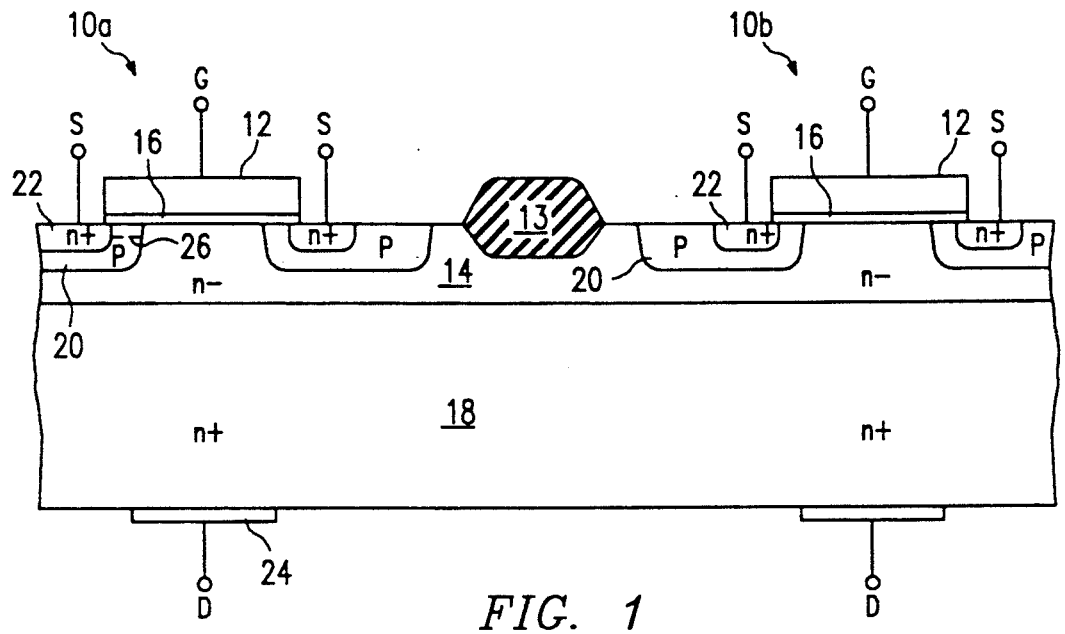
FIG. 1 illustrates a prior art vertical transistor.
Figure 3:
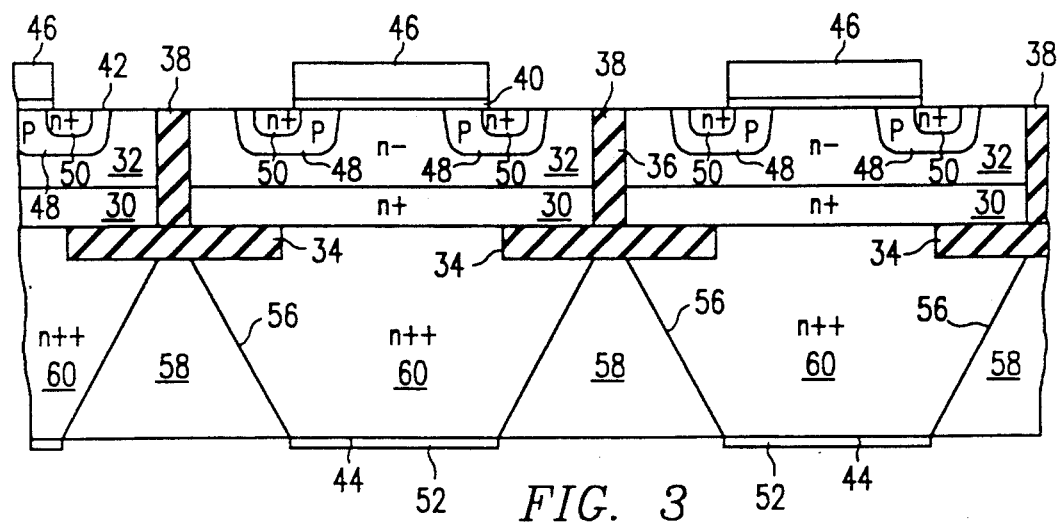
FIG. 3 illustrates an alternate embodiment of the vertical transistor of the present invention.

The preferred embodiment of the present invention is best understood by referring to FIGS. 1-3 of the drawings, like numerals being used for like and corresponding parts of the various drawings.

FIG. 1 illustrates a cross-sectional side view of a prior art vertical transistor structure showing two transistors 10a and b. In the illustrated embodiment, N-channel devices are shown; however, as would be known to one skilled in the art, P-channel devices could similarly be provided by interchanging the conductivity types of the doped regions.

After obtaining isolation oxide 13 by conventional thermal oxidation, gates 12 are formed over an N-epitaxial layer 14 and separated therefrom by gate oxide layer 16. The epitaxial layer 14 is formed over a N+ semiconductor layer (hereinafter "substrate") 18. First P doped region 20 are formed in the epitaxial layer 14, such that a portion of the first doped regions 20 underlies gate 12. Second N+ doped regions 22 are formed within the respective first doped regions 20. Second doped regions 22 comprise the sources of the respective transistors. The drain contacts 24 are formed on the lower surface of the substrate 18.

In operation, a voltage is placed on the gate 12 to form an inversion layer 26 in the first doped region 20. This results in a low impedance path between the source 22 and drain 24.

The vertical transistors shown in FIG. 1 provide several advantages over the more commonplace lateral MOS transistors. First, the channel width per unit area of a power DMOS is higher in case of vertical device as compared to a lateral device, because no space at the surface needs to be allocated to drain regions. This allows more current per unit area or lower $R_{(on)}$ to be achieved. Second, since drain electrode is at the bottom, only two terminals, source and gate need to be interconnected at the top surface rather than all three - source, gate and drain - in the lateral device. This simplified interconnect requirement leads to a simpler metal interconnect process.

A serious limitation of the vertical transistor is also shown in FIG. 1. The drain contacts 24 of the transistors 10a-b are both connected to a common doped layer 18. Hence, both drains are electrically tied together which limits their usefulness in a circuit.

Figure 2A:
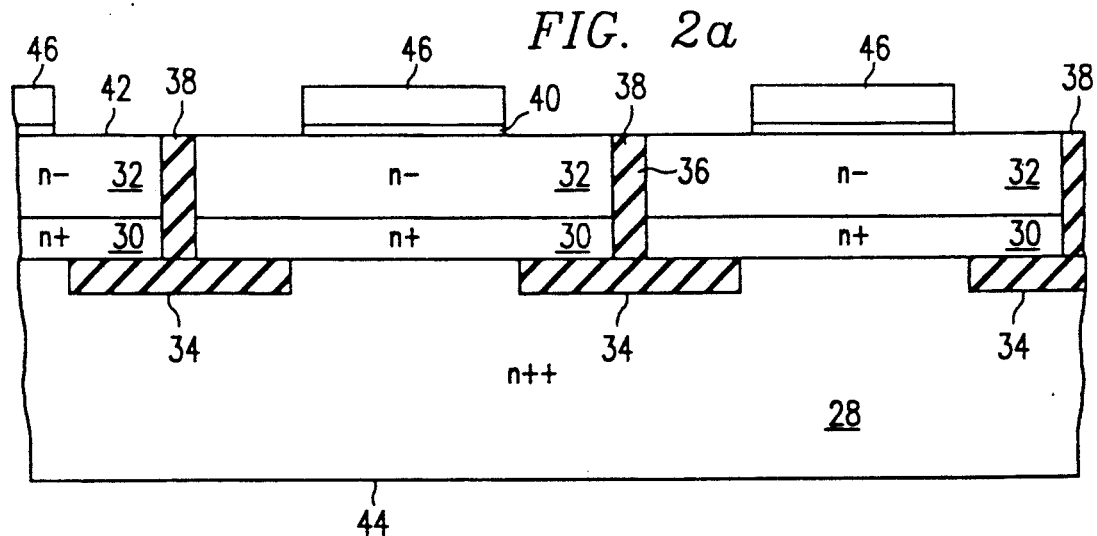
FIGS. 2a, 2b, 2c illustrate the fabrication of the vertical transistor of the present invention.
Figure 2B:
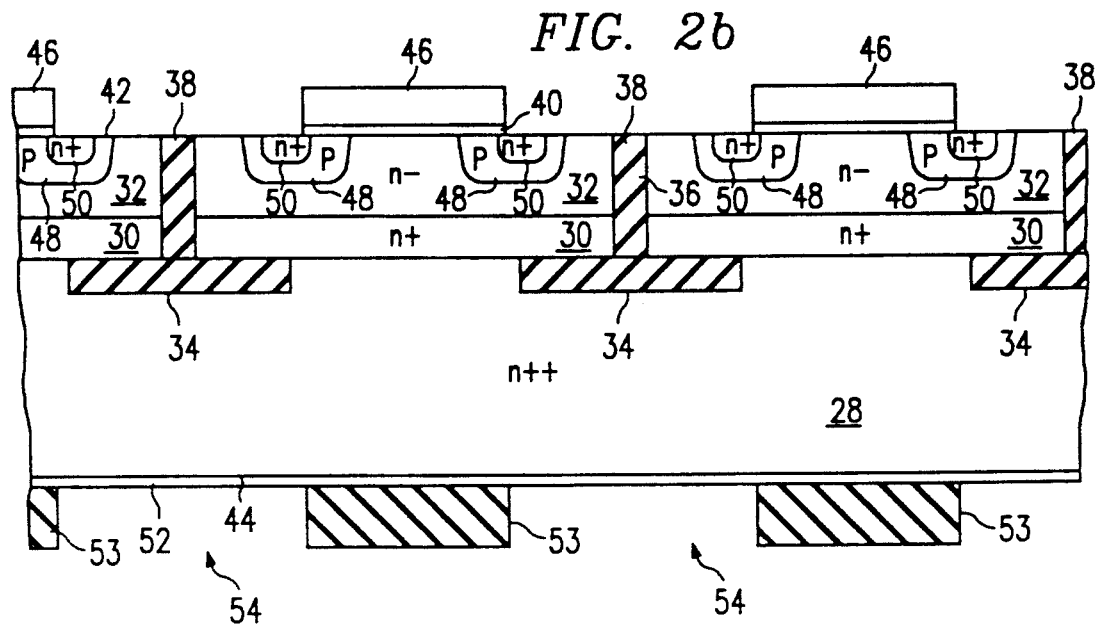
Figure 2C:
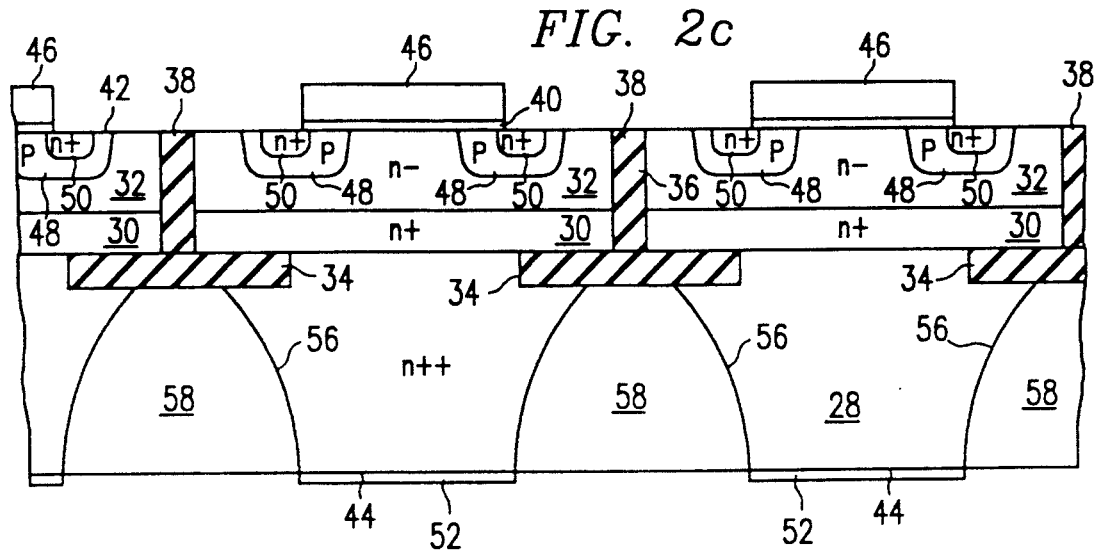

FIGS. 2a-c illustrate cross-sectional side views of the transistor of the present invention during three processing stages. In the preferred embodiment of the present invention, SOI (silicon-on-insulator) materials are used to integrate several bottom drain contact devices on a single chip while providing isolation between the devices. FIGS. 2a-c illustrate a device using a polysilicon substrate. FIG. 3 illustrates a bonded wafer embodiment, where a silicon substrate is used.

Referring to FIGS. 2a-c, a "discretionary" SOI substrate is used wherein a polysilicon base layer is separated from N+ and N− epitaxial layers 30 and 32, respectively, by isolation regions 34, typically an oxide. Thus, unlike many SOI structures, the oxide layer 34 is not a uniform layer throughout the substrate.

Trenches 36 are etched through the epitaxial layers 30 and 32. The trenches 36 are filled with oxide 38 or other insulating material. Thereafter, a gate oxide layer 40 is formed over the upper surface 42 of the substrate. For purposes of clarity, the substrate will be referred to as having an upper surface 42 and a lower surface 44. "Upper" and "lower" are for orientation purposes only and are not meant to describe the actual orientation of the wafer at any particular point in time. In fact, many wafers are fabricated with the upper surface 42 facing downward in the processing chamber.

A polysilicon layer is formed over the gate oxide layer 40 and is etched along with the gate oxide layer 40 to produce gates 46. Typically, the gates are formed with a doped polysilicon layer so that they are conductive.

Referring to FIG. 2b, the first and second doped regions 48 and 50 are formed in the upper surface 42 of the substrate. The depth and lateral diffusion of the doped regions 48 and 50 are controlled by the time and temperature of the diffusion. Typically, a boron dopant is implanted to form the P type doped regions and a phosphorous dopant is used to form the N type doped regions. In the illustrated embodiment, dual sources (second doped regions 50) are provided to increase the current which may be conducted by the transistor. A metal layer 52 is then formed on the lower surface 44 of the substrate to provide the drain contacts. The lower surface 44 is patterned with a photoresist mask 53 to provide windows 54 below the isolation oxide regions 34.

In FIG. 2c, an etch is performed to produce trenches 56. For a poly-base layer 28, a planar etch, such as HF—HNO$_3$—HAc (8%, 75% and 17%, respectively), is used to isotopically etch the base layer 28. In this process, the isolation oxide regions 34 act as an etch stop. Thus, the active regions in the epitaxial layers 30 and 32 are protected from any damage caused by the backside etch. After the etch is complete, the photoresist mask 53 is removed and the trenches 56 are filled with an isolating material 58. In the preferred embodiment, the isolating material 58 comprises a polyimide.

FIG. 3 illustrates an alternative embodiment of the present invention wherein the SOI substrate includes an silicon base layer 60. In the embodiment, an etchant such as KOH is typically used to perform the backside etch, anisotropically.

Whereas the present invention has been described in connection with an SOI substrate, it should be clear that other semiconductor materials, such as gallium arsenide, could be used in connection with the present invention. Further, while the FIGUREs illustrate N channel devices, P channel devices could also be formed by reversing the conductivity types of appropriate layers and doped regions, as would be known to one skilled in the art.

Although the present invention has been described in detail, it should be understood that various changes, substitutions and alterations can be made herein without departing from the spirit and scope of the invention as defined by the appended claims.

What is claimed is:

1. A method of forming a transistor comprising the steps of;
   forming an isolation layer overlying a semiconductor substrate;
   forming a semiconductor layer of a first conductivity type overlying the isolation layer;
   forming a first doped region of a second conductivity type in the semiconductor layer;
   forming a second doped region of said first conductivity type in said first doped region;
   etching trenches through the semiconductor substrate using the isolation layer as an etch stop; and
   filling the trenches with an insulating material.

2. The method of claim 1 and further comprising the step of etching trenches through the semiconductor layer using said isolation layer as an etch stop and filling said trenches with an insulating material.

3. The method of claim 1 wherein said step of forming an isolation layer comprises the step of forming an isolation layer over a polysilicon layer.

4. The method of claim 1 and further comprising the steps of forming a thin oxide layer overlying the semiconductor layer and forming a conductive layer thereover.

5. The method of claim 1 wherein said step of etching trenches comprises the step of anisotropically etching trenches through the semiconductor substrate.

6. The method of claim 1 wherein said step of filling the trenches comprises the step of filling the trenches with a polyimide.

7. The method of claim 1 wherein said step of forming an isolation layer comprises the step of forming an isolation layer over a silicon substrate.

* * * * *